(12) United States Patent
Jin et al.

(10) Patent No.: US 8,539,328 B2
(45) Date of Patent: Sep. 17, 2013

(54) SYSTEMS AND METHODS FOR NOISE INJECTION DRIVEN PARAMETER SELECTION

(75) Inventors: Ming Jin, Fremont, CA (US); Fan Zhang, Milpitas, CA (US); Wu Chang, Santa Clara, CA (US)

(73) Assignee: LSI Corporation, San Jose, CA (US)

( * ) Notice: Subject to any disclaimer, the term of this patent is extended or adjusted under 35 U.S.C. 154(b) by 259 days.

(21) Appl. No.: 13/213,808

(22) Filed: Aug. 19, 2011

(65) Prior Publication Data

US 2013/0047053 A1 Feb. 21, 2013

(51) Int. Cl.
*G06F 7/02* (2006.01)
*H03M 13/00* (2006.01)

(52) U.S. Cl.
USPC ........................................................ 714/819

(58) Field of Classification Search
USPC ......... 714/746, 776, 780, 784, 800; 375/152, 375/342
See application file for complete search history.

(56) References Cited

U.S. PATENT DOCUMENTS

| | | | |
|---|---|---|---|
| 5,001,712 A * | 3/1991 | Splett et al. | 714/703 |
| 5,278,703 A | 1/1994 | Rub et al. | |
| 5,278,846 A | 1/1994 | Okayama et al. | |
| 5,317,472 A | 5/1994 | Choi et al. | |
| 5,325,402 A | 6/1994 | Ushirokawa | |
| 5,392,299 A | 2/1995 | Rhines et al. | |
| 5,471,500 A | 11/1995 | Blaker et al. | |
| 5,513,192 A | 4/1996 | Janku et al. | |
| 5,523,903 A | 6/1996 | Hetzler et al. | |
| 5,550,870 A | 8/1996 | Blaker et al. | |
| 5,612,964 A | 3/1997 | Haraszti | |
| 5,701,314 A | 12/1997 | Armstrong et al. | |
| 5,710,784 A | 1/1998 | Kindred et al. | |
| 5,712,861 A | 1/1998 | Inoue et al. | |
| 5,717,706 A | 2/1998 | Ikeda | |
| 5,768,044 A | 6/1998 | Hetzler et al. | |
| 5,802,118 A | 9/1998 | Bliss et al. | |
| 5,844,945 A | 12/1998 | Nam et al. | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |

(Continued)

FOREIGN PATENT DOCUMENTS

| | | |
|---|---|---|
| EP | 0522578 | 1/1993 |
| EP | 0631277 | 12/1994 |

(Continued)

OTHER PUBLICATIONS

U.S. Appl. No. 11/461,026, filed Jul. 31, 2006, Tan, Weijun.

(Continued)

*Primary Examiner* — Shelly A Chase
(74) *Attorney, Agent, or Firm* — Hamilton DeSanctis & Cha

(57) ABSTRACT

Various embodiments of the present invention provide systems and methods for data processing. As an example, a data processing circuit is disclosed that includes a noise injection circuit. The noise injection circuit is operable to: determine a difference between a first data output and a second data output to yield an error; and augment an interim data with a noise value corresponding to the error to yield a noise injected output. The interim data may be either the first data output or the second data output.

20 Claims, 6 Drawing Sheets

(56) References Cited

U.S. PATENT DOCUMENTS

| | | |
|---|---|---|
| 6,005,897 A | 12/1999 | McCallister et al. |
| 6,023,783 A | 2/2000 | Divsalar et al. |
| 6,029,264 A | 2/2000 | Kobayashi et al. |
| 6,041,432 A | 3/2000 | Ikeda |
| 6,065,149 A | 5/2000 | Yamanaka |
| 6,097,764 A | 8/2000 | McCallister et al. |
| 6,145,110 A | 11/2000 | Khayrallah |
| 6,216,249 B1 | 4/2001 | Bliss et al. |
| 6,216,251 B1 | 4/2001 | McGinn |
| 6,229,467 B1 | 5/2001 | Eklund et al. |
| 6,266,795 B1 | 7/2001 | Wei |
| 6,317,472 B1 | 11/2001 | Choi et al. |
| 6,351,832 B1 | 2/2002 | Wei |
| 6,377,610 B1 | 4/2002 | Hagenauer et al. |
| 6,381,726 B1 | 4/2002 | Weng |
| 6,438,717 B1 | 8/2002 | Butler et al. |
| 6,466,631 B1 * | 10/2002 | Schenk ............... 375/346 |
| 6,473,878 B1 | 10/2002 | Wei |
| 6,476,989 B1 | 11/2002 | Chainer et al. |
| 6,625,775 B1 | 9/2003 | Kim |
| 6,657,803 B1 | 12/2003 | Ling et al. |
| 6,671,404 B1 | 12/2003 | Kawatani et al. |
| 6,748,034 B2 | 6/2004 | Hattori et al. |
| 6,757,862 B1 | 6/2004 | Marianetti |
| 6,785,863 B2 | 8/2004 | Blankenship et al. |
| 6,788,654 B1 | 9/2004 | Hashimoto et al. |
| 6,810,502 B2 | 10/2004 | Eidson |
| 6,980,382 B2 | 12/2005 | Hirano et al. |
| 6,986,098 B2 | 1/2006 | Poeppelman |
| 7,010,051 B2 | 3/2006 | Murayama et al. |
| 7,047,474 B2 | 5/2006 | Rhee et al. |
| 7,058,873 B2 | 6/2006 | Song et al. |
| 7,073,118 B2 | 7/2006 | Greenberg et al. |
| 7,093,179 B2 | 8/2006 | Shea |
| 7,113,356 B1 | 9/2006 | Wu |
| 7,136,244 B1 | 11/2006 | Rothberg |
| 7,173,783 B1 | 2/2007 | McEwen et al. |
| 7,184,486 B1 | 2/2007 | Wu et al. |
| 7,191,378 B2 | 3/2007 | Eroz et al. |
| 7,203,015 B2 | 4/2007 | Sakai et al. |
| 7,203,887 B2 | 4/2007 | Eroz et al. |
| 7,236,757 B2 | 6/2007 | Raghaven et al. |
| 7,257,764 B2 | 8/2007 | Suzuki et al. |
| 7,310,768 B2 | 12/2007 | Eidson et al. |
| 7,313,750 B1 | 12/2007 | Feng et al. |
| 7,370,258 B2 | 5/2008 | Iancu et al. |
| 7,403,752 B2 | 7/2008 | Raghaven et al. |
| 7,430,256 B2 | 9/2008 | Zhidkov |
| 7,502,189 B2 | 3/2009 | Sawaguchi et al. |
| 7,505,537 B1 | 3/2009 | Sutardja |
| 7,509,927 B2 | 3/2009 | Mukomilow |
| 7,523,375 B2 | 4/2009 | Spencer |
| 7,587,657 B2 | 9/2009 | Haratsch |
| 7,590,168 B2 | 9/2009 | Raghavan et al. |
| 7,702,989 B2 | 4/2010 | Graef et al. |
| 7,712,008 B2 | 5/2010 | Song et al. |
| 7,738,201 B2 | 6/2010 | Jin et al. |
| 7,752,523 B1 | 7/2010 | Chaichanavong et al. |
| 7,801,200 B2 | 9/2010 | Tan |
| 7,802,163 B2 | 9/2010 | Tan |
| 2003/0063405 A1 | 4/2003 | Jin et al. |
| 2003/0081693 A1 | 5/2003 | Raghaven et al. |
| 2003/0087634 A1 | 5/2003 | Raghaven et al. |
| 2003/0112896 A1 | 6/2003 | Raghaven et al. |
| 2003/0134607 A1 | 7/2003 | Raghaven et al. |
| 2004/0071206 A1 | 4/2004 | Takatsu |
| 2004/0098659 A1 | 5/2004 | Bjerke et al. |
| 2005/0010855 A1 | 1/2005 | Lusky |
| 2005/0078399 A1 | 4/2005 | Fung et al. |
| 2005/0111540 A1 | 5/2005 | Modrie et al. |
| 2005/0157780 A1 | 7/2005 | Werner et al. |
| 2005/0195749 A1 | 9/2005 | Elmasry et al. |
| 2005/0216819 A1 | 9/2005 | Chugg et al. |
| 2005/0273688 A1 | 12/2005 | Argon |
| 2006/0020872 A1 | 1/2006 | Richardson et al. |
| 2006/0031737 A1 | 2/2006 | Chugg et al. |
| 2006/0123285 A1 | 6/2006 | De Araujo et al. |
| 2006/0140311 A1 | 6/2006 | Ashley et al. |
| 2006/0168493 A1 | 7/2006 | Song et al. |
| 2006/0195772 A1 | 8/2006 | Graef et al. |
| 2006/0210002 A1 | 9/2006 | Yang et al. |
| 2006/0248435 A1 | 11/2006 | Haratsch |
| 2006/0256670 A1 | 11/2006 | Park et al. |
| 2007/0011569 A1 | 1/2007 | Vila Casado et al. |
| 2007/0047121 A1 | 3/2007 | Eleftheriou et al. |
| 2007/0047635 A1 | 3/2007 | Stojanovic et al. |
| 2007/0110200 A1 | 5/2007 | Mergen et al. |
| 2007/0230407 A1 | 10/2007 | Petrie et al. |
| 2007/0286270 A1 | 12/2007 | Huang et al. |
| 2008/0049825 A1 | 2/2008 | Chen et al. |
| 2008/0055122 A1 | 3/2008 | Tan |
| 2008/0065970 A1 | 3/2008 | Tan |
| 2008/0069373 A1 | 3/2008 | Jiang et al. |
| 2008/0168330 A1 | 7/2008 | Graef et al. |
| 2008/0276156 A1 | 11/2008 | Gunnam |
| 2008/0301521 A1 | 12/2008 | Gunnam |
| 2009/0185643 A1 | 7/2009 | Fitzpatrick et al. |
| 2009/0199071 A1 | 8/2009 | Graef |
| 2009/0235116 A1 | 9/2009 | Tan et al. |
| 2009/0235146 A1 | 9/2009 | Tan |
| 2009/0259915 A1 | 10/2009 | Livshitz et al. |
| 2009/0273492 A1 | 11/2009 | Yang et al. |
| 2009/0274247 A1 | 11/2009 | Galbraith et al. |
| 2010/0002795 A1 | 1/2010 | Raghaven et al. |
| 2010/0042877 A1 | 2/2010 | Tan |
| 2010/0042890 A1 | 2/2010 | Gunnam |
| 2010/0050043 A1 | 2/2010 | Savin |
| 2010/0061492 A1 | 3/2010 | Noeldner |
| 2010/0070837 A1 | 3/2010 | Xu et al. |
| 2010/0164764 A1 | 7/2010 | Nayak |
| 2010/0185914 A1 | 7/2010 | Tan et al. |
| 2011/0075569 A1 | 3/2011 | Marrow et al. |
| 2011/0080211 A1 | 4/2011 | Yang et al. |
| 2011/0167246 A1 | 7/2011 | Yang et al. |

FOREIGN PATENT DOCUMENTS

| | | |
|---|---|---|
| EP | 1814108 | 8/2007 |
| WO | WO 2006/016751 | 2/2006 |
| WO | WO 2006/134527 | 12/2006 |
| WO | WO 2007/091797 | 8/2007 |
| WO | WO 2010/126482 | 4/2010 |
| WO | 2010/101578 | 9/2010 |
| WO | WO 2010/101578 | 9/2010 |

OTHER PUBLICATIONS

U.S. Appl. No. 11/461,198, filed Jul. 31, 2006, Tan, Weijun.
U.S. Appl. No. 11/461,283, filed Jul. 31, 2006, Tan, Weijun.
U.S. Appl. No. 12/540,283, filed Aug. 12, 2009, Liu, et al.
U.S. Appl. No. 12/652,201, filed Jan. 5, 2010, Mathew, et al.
U.S. Appl. No. 12/763,050, filed Apr. 19, 2010, Ivkovic, et al.
U.S. Appl. No. 12/792,555, filed Jun. 2, 2010, Liu, et al.
U.S. Appl. No. 12/887,317, filed Sep. 21, 2010, Xia, et al.
U.S. Appl. No. 12/887,330, filed Sep. 21, 2010, Zhang, et al.
U.S. Appl. No. 12/887,369, filed Sep. 21, 2010, Liu, et al.
U.S. Appl. No. 12/901,816, filed Oct. 11, 2010, Li, et al.
U.S. Appl. No. 12/901,742, filed Oct. 11, 2010, Yang.
U.S. Appl. No. 12/917,756, filed Nov. 2, 2010, Miladinovic, et al.
U.S. Appl. No. 12/947,931, filed Nov. 17, 2010, Yang, Shaohua.
U.S. Appl. No. 12/947,947, filed Nov. 17, 2010, Ivkovic, et al.
U.S. Appl. No. 12/972,942, filed Dec. 20, 2010, Liao, et al.
U.S. Appl. No. 12/992,948, filed Nov. 16, 2010, Yang, et al.
U.S. Appl. No. 13/021,814, filed Feb. 7, 2011, Jin, Ming, et al.
U.S. Appl. No. 13/031,818, filed Feb. 22, 2011, Xu, Changyou, et al.
U.S. Appl. No. 13/050,129, filed Mar. 17, 2011, Tan et al.
U.S. Appl. No. 13/050,765, filed Mar. 17, 2011, Yang, et al.
U.S. Appl. No. 13/088,119, filed Apr. 15, 2011, Zhang, et al.
U.S. Appl. No. 13/088,146, filed Apr. 15, 2011, Li, et al.
U.S. Appl. No. 13/088,178, filed Apr. 15, 2011, Sun, et al.
U.S. Appl. No. 13/126,748, filed Apr. 28, 2011, Tan.
U.S. Appl. No. 13/167,764, filed Jun. 24, 2011, Li, Zongwang, et al.
U.S. Appl. No. 13/167,771, filed Jun. 24, 2011, Li, Zongwang, et al.

U.S. Appl. No. 13/167,775, filed Jun. 24, 2011, Li, Zongwang.
U.S. Appl. No. 13/186,146, filed Jul. 19, 2011, Mathew, et al.
U.S. Appl. No. 13/186,213, filed Jul. 19, 2011, Mathew, et al.
U.S. Appl. No. 13/186,234, filed Jul. 19, 2011, Xia, Haitao, et al.
U.S. Appl. No. 13/186,251, filed Jul. 19, 2011, Xia, Haitao, et al.
U.S. Appl. No. 13/186,174, filed Jul. 19, 2011, Mathew, et al.
U.S. Appl. No. 13/186,197, filed Jul. 19, 2011, Mathew, George et al.
U.S. Appl. No. 13/213,751, filed Aug. 19, 2011, Zhang, Fan, et al.
U.S. Appl. No. 13/213,808, filed Aug. 19, 2011, Jin, Ming.
U.S. Appl. No. 13/220,142, filed Aug. 29, 2011, Chang, Wu, et al.
U.S. Appl. No. 13/227,538, filed Sep. 8, 2011, Yang, Shaohua, et al.
U.S. Appl. No. 13/227,544, filed Sep. 8, 2011, Yang, Shaohua, et al.
U.S. Appl. No. 13/239,683, filed Sep. 22, 2011, Xu, Changyou.
U.S. Appl. No. 13/239,719, filed Sep. 22, 2011, Xia, Haitao, et al.
U.S. Appl. No. 13/251,342, filed Oct. 2, 2011, Xia, Haitao, et al.
U.S. Appl. No. 13/269,832, filed Oct. 10, 2011, Xia, Haitao, et al.
U.S. Appl. No. 13/269,852, filed Oct. 10, 2011, Xia, Haitao, et al.
U.S. Appl. No. 13/284,819, filed Oct. 28, 2011, Tan, Weijun, et al.
U.S. Appl. No. 13/284,730, filed Oct. 28, 2011, Zhang, Fan, et al.
U.S. Appl. No. 13/284,754, filed Oct. 28, 2011, Zhang, Fan, et al.
U.S. Appl. No. 13/284,767, filed Oct. 28, 2011, Zhang, Fan, et al.
U.S. Appl. No. 13/284,826, filed Oct. 28, 2011, Tan, Weijun, et al.
U.S. Appl. No. 13/295,150, filed Nov. 14, 2011, Li, Zongwang, et al.
U.S. Appl. No. 13/295,160, filed Nov. 14, 2011, Li, Zongwang, et al.
U.S. Appl. No. 13/251,340, filed Oct. 3, 2011, Xia, Haitao, et al.
Amer et al "Design Issues for a Shingled Write Disk System" MSST IEEE 26th Symposium May 2010.
Bahl, et al "Optimal decoding of linear codes for Minimizing symbol error rate", IEEE Trans. Inform. Theory, vol. 20, pp. 284-287, Mar. 1974.
Casado et al., Multiple-rate low-denstiy parity-check codes with constant blocklength, IEEE Transations on communications, Jan. 2009, vol. 57, pp. 75-83.
Collins and Hizlan, "Determinate State Convolutional Codes" IEEE Transactions on Communications, Dec. 1993.
Eleftheriou, E. et al., "Low Density Parity-Check Codes for Digital Subscriber Lines", Proc ICC 2002, pp. 1752-1757.
Fisher, R et al., "Adaptive Thresholding"[online] 2003 [retrieved on May 28, 2010] Retrieved from the Internet <URL:http://homepages.inf.ed.ac.uk/rbf/HIPR2/adpthrsh.htm.
Fossnorier, Marc P.C. "Quasi-Cyclic Low-Density Parity-Check Codes From Circulant Permutation Maricies" IEEE Transactions on Information Theory, vol. 50, No. 8 Aug. 8, 2004.
Gibson et al "Directions for Shingled-Write and Two-Dimensional Magnetic Recording System" Architectures: Synergies with Solid-State Disks Carnegie Mellon Univ. May 1, 2009.
K. Gunnam et al., "Next Generation iterative LDPC solutions for magnetic recording storage", invited paper. The Asilomar Conference on Signals, Systems, and Computers, Nov. 2008.
K. Gunnam et al., "Value-Reuse Properties of Min-Sum for GF(q)" (dated Oct. 2006) Dept. of ECE, Texas A&M University Technical Note, published about Aug. 2010.
K. Gunnam et al., "Value-Reuse Properties of Min-Sum for GF(q)"(dated Jul. 2008) Dept. of ECE, Texas A&M University Technical Note, published about Aug. 2010.
K. Gunnam "Area and Energy Efficient VLSI Architectures for Low-Density Parity-Check Decoders Using an On-The-Fly Computation" dissertation at Texas A&M University, Dec. 2006.
Han and Ryan, "Pinning Techniques for Low-Floor Detection/Decoding of LDPC-Coded Partial Response Channels", 5th International Symposium on Turbo Codes &Related Topics, 2008.
Hagenauer, J. et al A Viterbi Algorithm with Soft-Decision Outputs and its Applications in Proc. IEEE Globecom, pp. 47. 11-47 Dallas, TX Nov. 1989.
Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Lin et al "An efficient VLSI Architecture for non binary LDPC decoders"—IEEE Transaction on Circuits and Systems II vol. 57, Issue 1 (Jan. 2010) pp. 51-55.
Mohsenin et al., "Split Row: A Reduced Complexity, High Throughput LDPC Decoder Architecture", pp. 1-6, printed from www.ece.ucdavis.edu on Jul. 9, 2007.
Moon et al, "Pattern-dependent noise prediction in signal-dependent Noise," IEEE JSAC, vol. 19, No. 4 pp. 730-743, Apr. 2001.
Perisa et al "Frequency Offset Estimation Based on Phase Offsets Between Sample Correlations" Dept. of Info. Tech. University of Ulm 2005.
Sari H et al., "Transmission Techniques for Digital Terrestrial TV Broadcasting" IEEE Communications Magazine, IEEE Service Center Ny, NY vol. 33, No. 2 Feb. 1995.
Selvarathinam, A.: "Low Density Parity-Check Decoder Architecture for High Throughput Optical Fiber Channels" IEEE International Conference on Computer Design (ICCD '03) 2003.
Shu Lin, Ryan, "Channel Codes, Classical and Modern" 2009, Cambridge University Press, pp. 213-222.
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Wang Y et al., "A Soft Decision Decoding Scheme for Wireless COFDM With Application to DVB-T" IEEE Trans. on Consumer elec., IEEE Service Center, NY,NY vo. 50, No. 1 Feb. 2004.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xia et al, "A Chase-GMD algorithm of Reed-Solomon codes on perpendicular channels", IEEE Transactions on Magnetics, vol. 42 pp. 2603-2605, Oct. 2006.
Xia et al, "Reliability-based Reed-Solomon decoding for magnetic recording channels", IEEE International Conference on Communication pp. 1977-1981, May 2008.
Yeo et al., "VLSI Architecture for Iterative Decoders in Magnetic Storage Channels", Mar. 2001, pp. 748-755, IEEE trans. Magnetics, vol. 37, No. 2.
Youn, et al. "BER Perform. Due to Irrreg. of Row-Weight Distrib. of the Parity-Chk. Matirx in Irreg. LDPC Codes for 10-Gb/s Opt. Signls" Jrnl of Lightwave Tech., vol. 23, Sep. 2005.
Zhong et al., "Area-Efficient Min-Sum Decoder VLSI Architecture for High-Rate QC-LDPC Codes in Magnetic Recording", pp. 1-15, Submitted 2006, not yet published.
Zhong, "Block-LDPC: A Practical LDPC Coding System Design Approach", IEEE Trans. On Circuits, Regular Papers, vol. 5, No. 4, pp. 766-775, Apr. 2005.
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Iterative MAX-LOG-MAP and LDPC Detector/Decoder Hardware Implementation for Magnetic Read Channel", SRC TECHRON, pp. 1-4, Oct. 2005.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong, "VLSI Architecture of LDPC Based Signal Detection and Coding System for Magnetic Recording Channel", Thesis, RPI, Troy, NY, pp. 1-95, May 2006.

* cited by examiner

SYSTEMS AND METHODS FOR NOISE INJECTION DRIVEN PARAMETER SELECTION

BACKGROUND OF THE INVENTION

The present invention is related to systems and methods for characterizing circuit operation, and more particularly to systems and methods for injecting noise into a data processing circuit to enhance parameter selection.

It is typical to test a storage device during manufacturing both to reject defective devices and to adjust device parameters to improve operation. This process may include, for example, writing and reading data patterns from a storage medium associated with the device. Each time an error is detected, it is determined whether the parameters governing operation of circuitry associated with the storage device may be modified to reduce the possibility of such an error. This process results in adjustment of various operational parameters.

Most of the tested devices operate at reasonably good signal to noise ratio conditions. Because of this, errors are quite infrequent requiring a long time to collect enough errors to fully characterize circuit operation. Hence, for at least the aforementioned reasons, there exists a need in the art for advanced systems and methods for parameter selection.

BRIEF SUMMARY OF THE INVENTION

The present invention is related to systems and methods for characterizing circuit operation, and more particularly to systems and methods for injecting noise into a data processing circuit to enhance parameter selection.

Various embodiments of the present invention provide data processing circuits that include a noise injection circuit. The noise injection circuit is operable to: determine a difference between a first data output and a second data output to yield an error; and augment an interim data with a noise value corresponding to the error to yield a noise injected output. The interim data may be either the first data output or the second data output. In some instances of the aforementioned embodiments, the data processing circuit is implemented as part of a storage device or a receiving device. In some cases, the data processing circuit is implemented as part of an integrated circuit. In some instances of the aforementioned embodiments, the data processing circuit further includes a data detector circuit and a data decoder circuit. The data detector circuit is operable to apply a data detection algorithm to an input derived from the noise injected output to yield a detected output. The data decoder circuit is operable to apply a data decode algorithm to the detected output to yield a decoded output.

In various instances of the aforementioned embodiments, the data processing circuit further includes a selector circuit that is operable to provide a processing output selected from a group consisting of the first data output and the noise injected output. In some such instances, an included data processing circuit is operable to apply a data detection algorithm to the processing output to yield a detected output, and an included data decoder circuit is operable to apply a data decode algorithm to the detected output to yield a decoded output. In some instances of the aforementioned embodiments, the data processing circuit further includes an equalizer circuit that is operable to receive a data set and to provide an equalized output corresponding to the data set, wherein the first data output is the equalized output. In some such instances, the second data output is derived from an expected output. In particular instances, the data processing circuit further includes a partial response target circuit that is operable to provide the second data output based at least in part on the expected output.

In one or more instances of the aforementioned embodiments, determining the difference between the first data output and the second data output to yield the error includes subtracting the second data output from the first data output. In other instances of the aforementioned embodiments, determining the difference between the first data output and the second data output to yield the error includes subtracting the first data output from the second data output. In some cases, augmenting the interim data with the noise value corresponding to the error to yield the noise injected output includes: multiplying the error by a scaling factor to yield a scaled error; and adding the scaled error to one of the first data output or the second data output to yield the noise injected output.

Other embodiments of the present invention provide methods that include: receiving a first data output; receiving a second data output; determining a difference between a first data output and a second data output to yield an error; and augmenting an interim data with a noise value corresponding to the error to yield a noise injected output. In such embodiments, the interim data is either the first data output or the second data output. In some instances of the aforementioned embodiments, the method further includes: selecting one of the first data output and the second data output as a processing output; applying a data detection algorithm to the processing output to yield a detected output; and applying a data decode algorithm to the detected output to yield a decoded output. In some cases, the data detection algorithm is a Viterbi algorithm detection, and in other cases, the data detection algorithm is a maximum a posteriori data detection algorithm. In one or more cases, the data decode algorithm is a low density parity check algorithm. In other cases, the data decode algorithm is a Reed Solomon algorithm. In some cases, augmenting the interim data with the noise value corresponding to the error to yield the noise injected output includes multiplying the error by a scaling factor to yield a scaled error; and adding the scaled error to one of the first data output or the second data output to yield the noise injected output. In various cases, determining the difference between the first data output and the second data output to yield the error includes subtracting the first data output from the second data output. In other cases, determining the difference between the first data output and the second data output to yield the error includes subtracting the second data output from the first data output.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for characterizing circuit operation, and more particularly to systems and methods for injecting noise into a data processing circuit to enhance parameter selection.

Various embodiments of the present invention provide for noise injection based parameter modification. The injected noise corresponds to actual errors in a received data set. This noise is referred to herein as "actual noise" which is defined in its broadest sense to be any signal related to an error in a received data set. In some cases, the actual noise is a difference between a received input and an expected input multiplied by a scaling factor. Based upon the disclosure provided herein, one of ordinary skill in the art will recognize a variety of sources and/or approaches for generating actual noise that may be used in relation to different embodiments of the present invention. Such an approach of generating actual noise results in the occurrence of increased errors during data processing that allow for characterization of one or more parameters in a data processing circuit operating on the received data set. Further, the injection of actual noise rather than random noise provides an advantage in that the injected noise causes only a limited impact on the characteristics of the data processing circuit. In contrast, random noise has Gaussian noise characteristics that cause a change in the original characteristics of the data processing circuit that adversely impacts the ability to properly characterize parameters.

Figure 1:
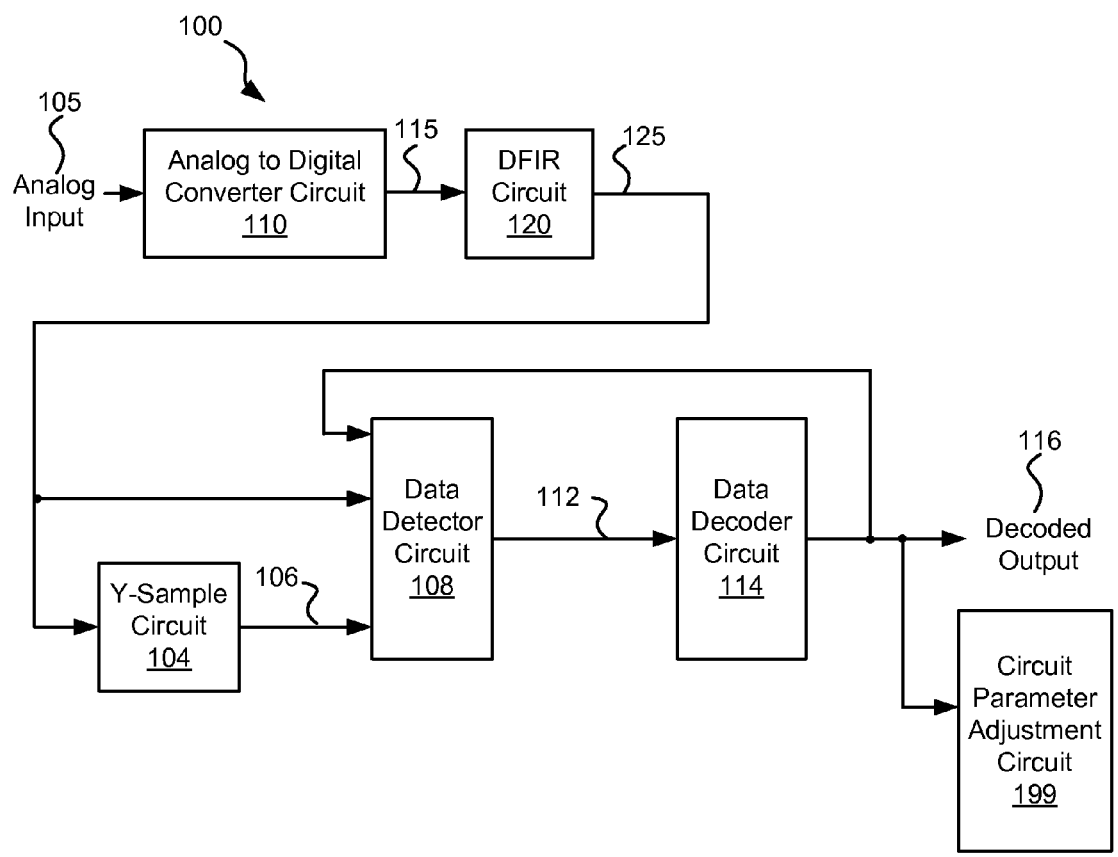
FIG. 1 depicts a prior art data processing circuit including a circuit parameter adjustment circuit.

Turning to FIG. 1, a data processing circuit 100 including a circuit parameter adjustment circuit 199 is shown in accordance with some embodiments of the present invention. Data processing circuit 100 includes an analog to digital converter circuit 110 that receives an analog input 105 and provides a series of corresponding digital samples 115. Digital samples 115 are provided to a digital finite impulse response circuit 120 that operates to equalize the received digitals samples 115 to yield an equalized output 125.

Equalized output 125 is provided to both a data detector circuit 108 and a Y-sample circuit 104. Y-sample circuit 104 stores equalized output 125 as buffered data 106 for use in subsequent iterations through data detector circuit 108. Data detector circuit 108 provides a detected output 112 to a data decoder circuit 114. Data decoder circuit 114 provides a decoded output 116. One or more iterations through data detector circuit 108 and data decoder circuit 114 may be made in an effort to converge on the originally written data set. Decoded output 116 is provided to circuit parameter adjustment circuit 199. Circuit parameter adjustment circuit 199 modifies one or more parameters used by circuit 100 in an effort to reduce any errors remaining at the output of data detector circuit 108 and/or data decoder circuit 114.

Figure 2:
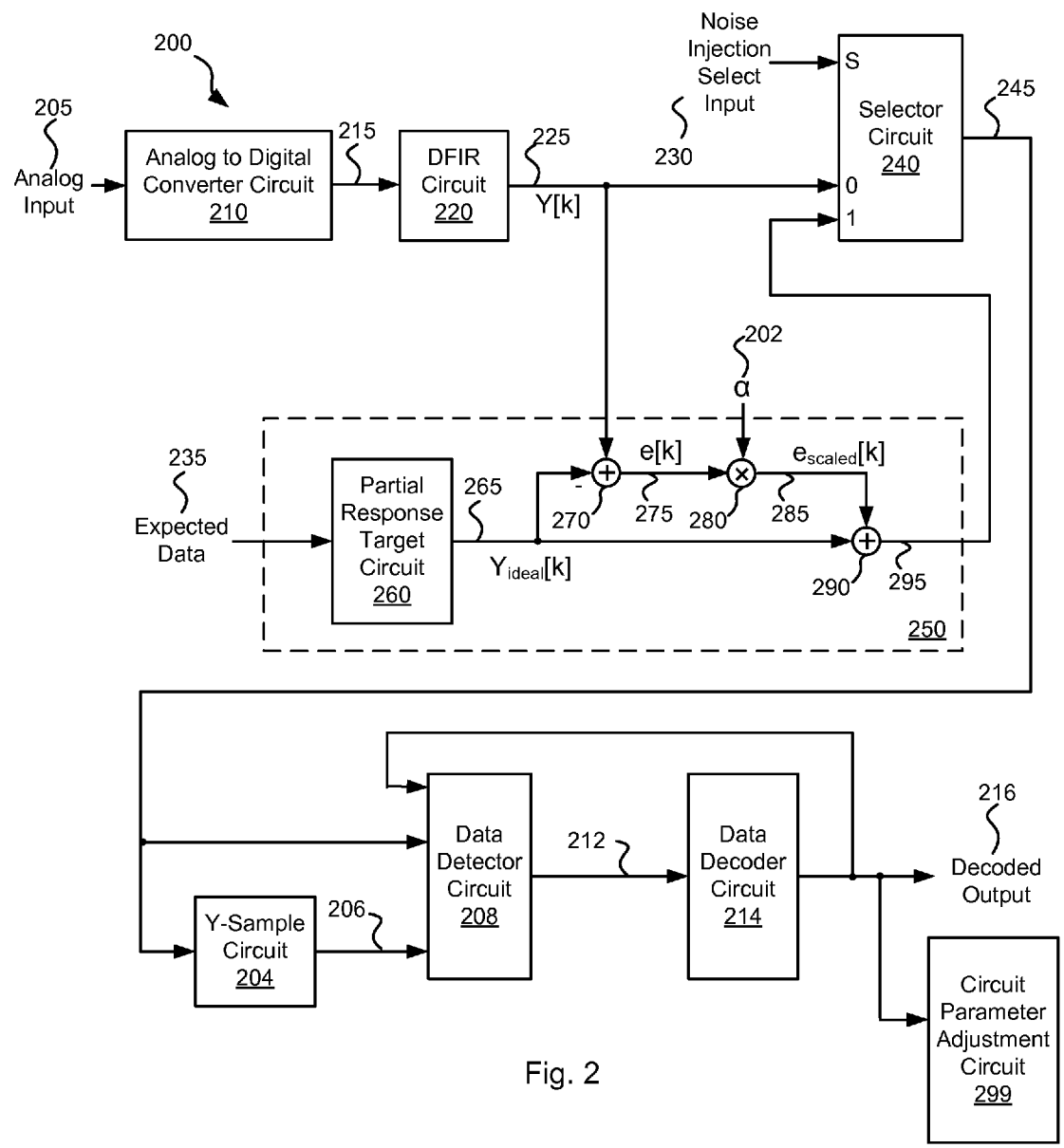
FIG. 2 depicts a data processing circuit including a noise injection circuit in accordance with some embodiments of the present invention.

Turning to FIG. 2, a data processing circuit 200 including a noise injection circuit 250 is shown in accordance with some embodiments of the present invention. Data processing circuit 200 includes an analog to digital converter circuit 210 that receives an analog input 205 and provides a series of corresponding digital samples 215. Analog input 205 may be derived from, for example, a storage medium or a data transmission channel. Based upon the disclosure provided herein, one of ordinary skill in the art will recognize a variety of sources of analog input 205. Analog to digital converter circuit 210 may be any circuit known in the art that is capable of converting an analog signal into a series of digital values representing the received analog signal. Digital samples 215 are provided to a digital finite impulse response circuit 220 that operates to equalize the received digitals samples 215 to yield an equalized output 225 (Y[k]). Based upon the disclosure provided herein, one of ordinary skill in the art will recognize a variety of equalizer circuits that may be used in place of digital finite impulse response circuit 220 in accordance with different embodiments of the present invention. Of note, equalized output 225 may include both electronic noise and media noise.

Equalized output 225 is provided to both a selector circuit 240 and noise injection circuit 250. A noise injected output 295 from noise injection circuit 250 is also provided to selector circuit 240. Selector circuit 240 provides one of equalized output 225 or noise injected output 295 as a processing output 245 depending upon an assertion level of a noise injection select input 230. In operation, noise injection select input 230 is de-asserted to cause selection of equalized output 225 to be provided as processing output 245 when normal operation of data processing circuit 200 is desired. In contrast, noise injection select input 230 is asserted to cause selection of noise injected output 295 to be provided as processing output 245 when circuit characterization of data processing circuit 200 is desired. Such circuit characterization involves modifying one or more parameters used by data processing circuit 200 to reduce any errors resulting from processing a given input data set. Such parameters may include, but are not limited to, gain parameters applied by analog to digital converter circuit 210 or by an analog front end circuit (not shown) from which analog input 205 is derived, filter taps used by digital finite impulse response filter 220, data detection parameters used by a data detector circuit 208, and/or data decode parameters used by a data decoder circuit 214. Based upon the disclosure provided herein, one of ordinary skill in the art will recognize a variety of parameters that may be adjusted based upon processing of noise injected output 295. Selection by assertion of noise injection select input 230 may be done at the time of manufacture of a device including data processing circuit 200, and/or after deployment of a device including data processing circuit 200.

Noise injection circuit 250 includes a partial response target circuit 260 that is operable to receive an expected data input 235 and to yield a filtered output 265 ($Y_{ideal}$[k]). Expected data input 235 is a known data set corresponding to the data set received as analog input 205. Thus, where data processing circuit 200 is operating perfectly, the result of processing analog input 205 will be expected data input 235. In some cases expected data input 235 is known and is maintained in a memory for use during parameter characterization. In other cases, as described more fully below in relation to the circuit of FIG. 3, expected data input 235 is derived from an earlier processing of a signal similar to analog input 205 by data processing circuit 200. Based upon the disclosure provided herein, one of ordinary skill in the art will recognize a variety of sources of expected data input 235 and formats thereof that may be used in relation to different embodiments of the present invention. Partial response target circuit 260 may be any circuit known in the art that is capable of rendering a received expected input 235 compatible with equalized output 225. It should be noted that where an ideal value of equalized output is available, it may be provided directly as filtered output 265 obviating the need for partial response target circuit 260. However, where some of the parameters to be adjusted in data processing circuit 200 govern operation of digital finite impulse response filter circuit 220 and/or analog to digital converter circuit 210 it may be desirable to retain partial response target circuit 260.

Both filtered output 265 and equalized output 225 are provided to a summation circuit 270 where filtered output 265 is subtracted from equalized output 225 to yield an error 275 (e[k]) in accordance with the following equation:

$$e[k] = Y[k] - Y_{ideal}[k],$$

where k designates particular instances of the associated values. Error 275 is provided to a multiplier circuit 280 where it is multiplied by a scalar value 202 (a) to yield a scaled error 285 ($e_{scaled}[k]$) in accordance with the following equation:

$$e_{scaled}[k] = \alpha \times e[k].$$

In some embodiments of the present invention, scalar value 202 may be dynamically calculated by calculating the standard deviation of error 275 for two different data sets in accordance with the following equations:

$$v_1 = \text{std\_deviation}(e_1[k]),$$
$$v_2 = \text{std\_deviation}(e_1[k]), \text{ and}$$
$$\alpha = \frac{v_2}{v_1} = 10^{\Delta/20},$$

where the subscript "1" indicates a first data set, the subscript "2" indicates a second data set, and Δ is the signal to noise ratio of the first data set less the signal to noise ratio of the second data set as defined by the following equation:

$$\Delta = 10 \cdot \log 10 \frac{P}{v_1^2} - 10 \cdot \log 10 \frac{P}{v_2^2} = 10 \cdot \log 10 \frac{v_2^2}{v_1^2}.$$

In other embodiments of the present invention, scalar value 202 is a fixed value that is programmed into a memory (not shown) that is accessible to data processing circuit 200. Scaled error 285 is then added to filtered output 265 by a summation circuit 290 to yield noise injected output 295 ($Y_{noise}[k]$) in accordance with the following equation:

$$Y_{noise}[k] = Y_{ideal}[k] + e_{scaled}[k].$$

As such, noise injected output 295 is similar to equalized output 225 with the noise accentuated.

Processing output 245 is provided to both data detector circuit 208 and a Y-sample circuit 204. Y-sample circuit 204 stores processing output 245 as buffered data 206 for use in subsequent iterations through data detector circuit 208. Data detector circuit 208 may be any data detector circuit known in the art that is capable of producing a detected output 212. As some examples, data detector circuit 204 may be, but is not limited to, a Viterbi algorithm detector circuit or a maximum a posteriori detector circuit as are known in the art. Based upon the disclosure provided herein, one of ordinary skill in the art will recognize a variety of data detector circuits that may be used in relation to different embodiments of the present invention. Detected output 212 may include both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present invention.

Detected output 212 is provided to data decoder circuit 214. Data decoder circuit 214 applies a data decoding algorithm to detected output 212 in an attempt to recover originally written data. The result of the data decoding algorithm is provided as a decoded output 216. Similar to detected output 212, decoded output 216 may include both hard decisions and soft decisions. Data decoder circuit 214 may be any data decoder circuit known in the art that is capable of applying a decoding algorithm to a received input. For example, data decoder circuit 214 may be, but is not limited to, a low density parity check decoder circuit or a Reed Solomon decoder circuit as are known in the art. Based upon the disclosure provided herein, one of ordinary skill in the art will recognize a variety of data decoder circuits that may be used in relation to different embodiments of the present invention. One or more iterations through data detector circuit 208 and data decoder circuit 214 may be made in an effort to converge on the originally written data set.

Decoded output 216 is provided to circuit parameter adjustment circuit 299. Circuit parameter adjustment circuit 299 modifies one or more parameters used by data processing circuit 200 in an effort to reduce any errors remaining at the output of data detector circuit 208 and/or data decoder circuit 214. Circuit parameter adjustment circuit 299 may be any circuit known in the art that is capable of adjusting one or more parameters governing the operation of a circuit. As just some examples, circuit parameter adjustment circuit 299 may adjust gain parameters applied by analog to digital converter circuit 210 or by an analog front end circuit (not shown) from which analog input 205 is derived, filter taps used by digital finite impulse response filter 220, data detection parameters used by a data detector circuit 208, and/or data decode parameters used by a data decoder circuit 214. Based upon the disclosure provided herein, one of ordinary skill in the art will recognize a variety of parameters that may be adjusted by circuit parameter adjustment circuit.

Figure 3:
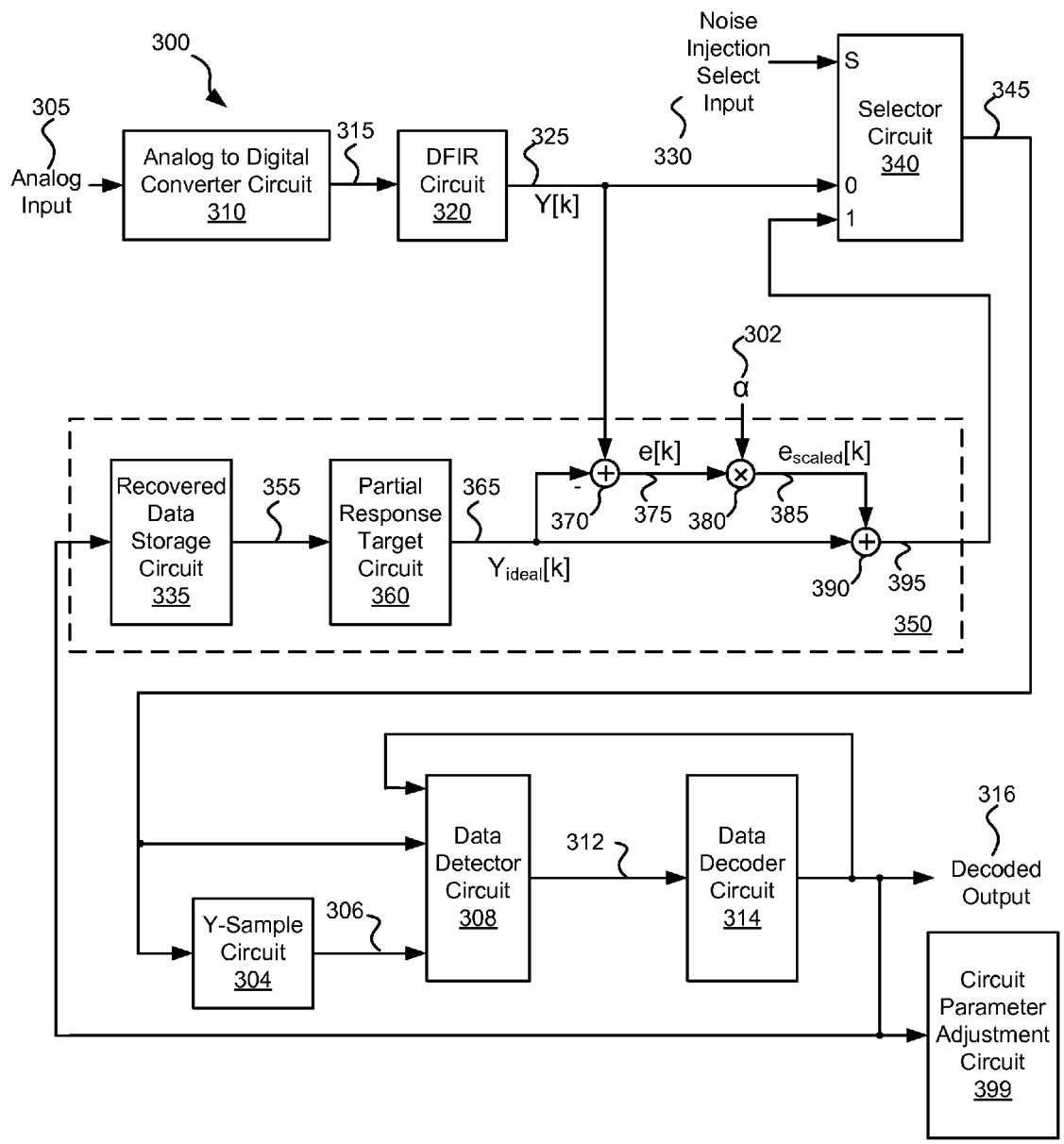
FIG. 3 depicts another data processing circuit including a noise injection circuit in accordance with other embodiments of the present invention.

Turning to FIG. 3, another data processing circuit 300 including a noise injection circuit 350 is shown in accordance with some embodiments of the present invention. Data processing circuit 300 includes an analog to digital converter circuit 310 that receives an analog input 305 and provides a series of corresponding digital samples 315. Analog input 305 may be derived from, for example, a storage medium or a data transmission channel. Based upon the disclosure provided herein, one of ordinary skill in the art will recognize a variety of sources of analog input 305. Analog to digital converter circuit 210 may be any circuit known in the art that is capable of converting an analog signal into a series of digital values representing the received analog signal. Digital samples 315 are provided to a digital finite impulse response circuit 320 that operates to equalize the received digitals samples 315 to yield an equalized output 325 (Y[k]). Based upon the disclosure provided herein, one of ordinary skill in the art will recognize a variety of equalizer circuits that may be used in place of digital finite impulse response circuit 320 in accordance with different embodiments of the present invention. Of note, equalized output 325 may include both electronic noise and media noise.

Equalized output 325 is provided to both a selector circuit 340 and noise injection circuit 350. A noise injected output 395 from noise injection circuit 350 is also provided to selector circuit 340. Selector circuit 340 provides one of equalized output 325 or noise injected output 395 as a processing output 345 depending upon an assertion level of a noise injection select input 330. In operation, noise injection select input 330 is asserted to cause selection of equalized output 325 to be provided as processing output 345 when normal operation of data processing circuit 300 is desired. In contrast, noise injection select input 330 is asserted to cause selection of noise injected output 395 to be provided as processing output 345 when circuit characterization of data processing circuit 300 is desired. Such circuit characterization involves modifying one or more parameters used by data processing circuit 300 to reduce any errors resulting from processing a given input data set. Such parameters may include, but are not limited to, gain parameters applied by analog to digital converter circuit 310 or by an analog front end circuit (not shown) from which analog input 305 is derived, filter taps used by digital finite impulse response filter 320, data detection parameters used by a data detector circuit 308, and/or data decode parameters used by a data decoder circuit 314. Based upon the disclosure provided herein, one of ordinary skill in the art will recognize a variety of parameters that may be adjusted based upon processing of noise injected output 395. Selection of through assertion of noise injection select input 330 may be done at the time of manufacture of a device including data processing circuit 300, and/or after deployment of a device including data processing circuit 300.

Noise injection circuit 350 includes a recovered data storage circuit 335 that stores a prior result of processing a data set corresponding to analog input 305. This prior processing result is an expected data input 355 that may be used to determine errors based upon a comparison with equalized output 325. In particular, expected data input 355 is provided to a partial response target circuit 360 that yields a filtered output 365 ($Y_{ideal}$[k]). Partial response target circuit 360 may be any circuit known in the art that is capable of rendering a received expected input 335 compatible with equalized output 325.

Both filtered output 365 and equalized output 325 are provided to a summation circuit 370 where filtered output 365 is subtracted from equalized output 325 to yield an error 375 (e[k]) in accordance with the following equation:

$$e[k]=Y[k]-Y_{ideal}[k].$$

where k designates particular instances of the associated values. Error 375 is provided to a multiplier circuit 380 where it is multiplied by a scalar value 302 ($\alpha$) to yield a scaled error 385 ($e_{scaled}$[k]) in accordance with the following equation:

$$e_{scaled}[k]=\alpha \times e[k].$$

In some embodiments of the present invention, scalar value 302 may be dynamically calculated by calculating the standard deviation of error 375 for two different data sets in accordance with the following equations:

$$v_1 = \text{std\_deviation}(e_1[k]),$$
$$v_2 = \text{std\_deviation}(e_2[k]), \text{ and}$$
$$\alpha = \frac{v_2}{v_1} = 10^{\Delta/20},$$

where the subscript "1" indicates a first data set, the subscript "2" indicates a second data set, and $\Delta$ is the signal to noise ratio of the first data set less the signal to noise ratio of the second data set as defined by the following equation:

$$\Delta = 10 \cdot \log 10 \frac{P}{v_1^2} - 10 \cdot \log 10 \frac{P}{v_2^2} = 10 \cdot \log 10 \frac{v_2^2}{v_1^2}.$$

In other embodiments of the present invention, scalar value 302 is a fixed value that is programmed into a memory (not shown) that is accessible to data processing circuit 300. Scaled error 385 is then added to filtered output 365 by a summation circuit 390 to yield noise injected output 395 ($Y_{noise}$[k]) in accordance with the following equation:

$$Y_{noise}[k]=Y_{ideal}[k]+e_{scaled}[k].$$

As such, noise injected output 395 is similar to equalized output 325 with the noise accentuated.

Processing output 345 is provided to both data detector circuit 308 and a Y-sample circuit 304. Y-sample circuit 304 stores processing output 345 as buffered data 306 for use in subsequent iterations through data detector circuit 308. Data detector circuit 308 may be any data detector circuit known in the art that is capable of producing a detected output 312. As some examples, data detector circuit 304 may be, but is not limited to, a Viterbi algorithm detector circuit or a maximum a posteriori detector circuit as are known in the art. Based upon the disclosure provided herein, one of ordinary skill in the art will recognize a variety of data detector circuits that may be used in relation to different embodiments of the present invention. Detected output 312 may include both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present invention.

Detected output 312 is provided to data decoder circuit 314. Data decoder circuit 314 applies a data decoding algorithm to detected output 312 in an attempt to recover originally written data. The result of the data decoding algorithm is provided as a decoded output 316. Similar to detected output 312, decoded output 316 may include both hard decisions and soft decisions. For example, data decoder circuit 314 may be any data decoder circuit known in the art that is capable of applying a decoding algorithm to a received input. Data decoder circuit 314 may be, but is not limited to, a low density parity check decoder circuit or a Reed Solomon decoder circuit as are known in the art. Based upon the disclosure provided herein, one of ordinary skill in the art will recognize a variety of data decoder circuits that may be used in relation to different embodiments of the present invention. One or more iterations through data detector circuit 308 and data decoder circuit 314 may be made in an effort to converge on the originally written data set.

Decoded output 316 is provided to circuit parameter adjustment circuit 399. Circuit parameter adjustment circuit 399 modifies one or more parameters used by data processing circuit 300 in an effort to reduce any errors remaining at the output of data detector circuit 308 and/or data decoder circuit 314. Circuit parameter adjustment circuit 399 may be any circuit known in the art that is capable of adjusting one or more parameters governing the operation of a circuit. As just some examples, circuit parameter adjustment circuit 399 may adjust gain parameters applied by analog to digital converter circuit 310 or by an analog front end circuit (not shown) from which analog input 305 is derived, filter taps used by digital finite impulse response filter 320, data detection parameters used by a data detector circuit 308, and/or data decode parameters used by a data decoder circuit 314. Based upon the disclosure provided herein, one of ordinary skill in the art will recognize a variety of parameters that may be adjusted by circuit parameter adjustment circuit.

Figure 4:
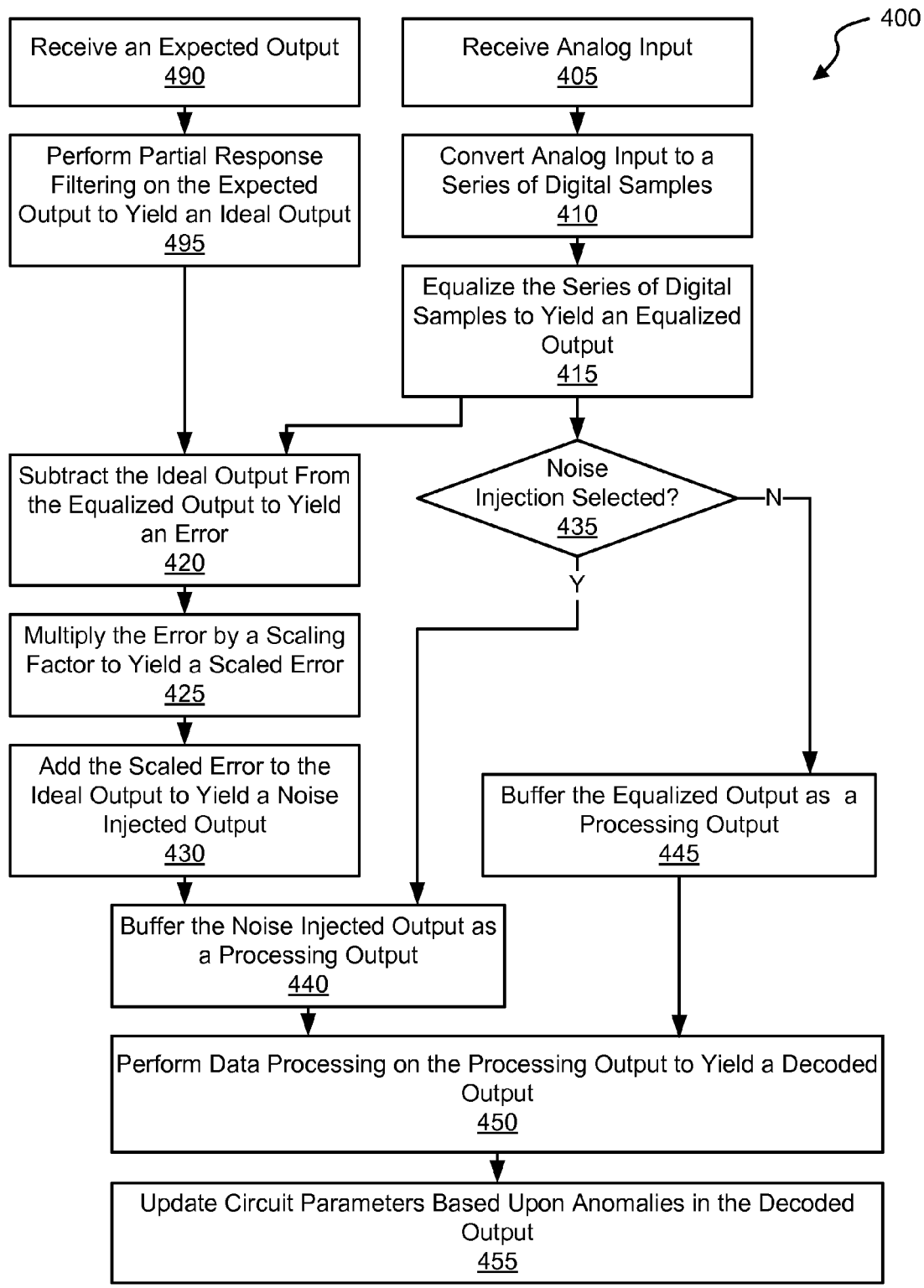
FIG. 4 is a flow diagram showing a process in accordance with various embodiments of the present invention for noise injection based parameter optimization.

Turning to FIG. 4, a flow diagram 400 shows a process in accordance with various embodiments of the present invention for noise injection based parameter optimization. Following flow diagram 400, an analog input is received (block 405). The analog input may be derived from, for example, a storage medium or a data transmission channel. Based upon the disclosure provided herein, one of ordinary skill in the art will recognize a variety of sources of the analog input. The analog input is converted to a series of digital samples (block 410). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (Y[k]) (block 415). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention. Of note, the equalized output may include both electronic noise and media noise.

In addition, an expected output is received (block 490). The expected output is a known data set corresponding to the data set received as the aforementioned analog input. Thus, where the data processing circuit processing the analog input is operating perfectly, the result of processing the analog input will be the expected output. In some cases the expected output is known and is maintained in a memory for use during parameter characterization. In other cases, the expected output is derived from the processing of an earlier processing of a signal similar to the analog input by the data processing circuit. Based upon the disclosure provided herein, one of ordinary skill in the art will recognize a variety of sources of the expected output and formats thereof that may be used in relation to different embodiments of the present invention.

A partial response filtering is applied to the expected output to yield a filtered output ($Y_{ideal}$[k]) (block 495). The partial response filtering may be any process known in the art that receives the expected output and yields a filtered output that is comparable to the aforementioned equalized output. The filtered output (block 495) is subtracted from the equalized output (block 415) to yield an error in accordance with the following equation (block 420):

$$e[k] = Y[k] - Y_{ideal}[k],$$

where k designates particular instances of the associated values. The error is multiplied by a scaling factor ($\alpha$) to yield a scaled error (block 425) in accordance with the following equation:

$$e_{scaled}[k] = \alpha \times e[k].$$

In some embodiments of the present invention, the scaling factor may be dynamically calculated by calculating the standard deviation of the error for two different data sets in accordance with the following equations:

$$v_1 = \text{std\_deviation}(e_1[k]),$$
$$v_2 = \text{std\_deviation}(e_2[k]), \text{ and}$$
$$\alpha = \frac{v_2}{v_1} = 10^{\Delta/20},$$

where the subscript "1" indicates a first data set, the subscript "2" indicates a second data set, and $\Delta$ is the signal to noise ratio of the first data set less the signal to noise ratio of the second data set as defined by the following equation:

$$\Delta = 10 \cdot \log 10 \frac{P}{v_1^2} - 10 \cdot \log 10 \frac{P}{v_2^2} = 10 \cdot \log 10 \frac{v_2^2}{v_1^2}.$$

In other embodiments of the present invention, the scaling factor is a fixed value that is programmed into a memory that is accessible to the data processing circuit. The scaled error is added to the filtered output to yield a noise injected output ($Y_{noise}$[k]) in accordance with the following equation (block 430):

$$Y_{noise}[k] = Y_{ideal}[k] + e_{scaled}[k].$$

As such, the noise injected output is similar to the aforementioned equalized output (block 415) with the noise accentuated.

It is determined whether noise injection is selected (block 435). Noise injection may be selected where data processing circuit characterization is desired. Such circuit characterization involves modifying one or more parameters used by the data processing circuit to reduce any errors resulting from processing a given input data set. Such parameters may include, but are not limited to, gain parameters applied by an analog to digital converter circuit or by an analog front end circuit from which the analog input is derived, filter taps used by a digital finite impulse response filter, data detection parameters used by a data detector circuit, and/or data decode parameters used by a data decoder circuit. Based upon the disclosure provided herein, one of ordinary skill in the art will recognize a variety of parameters that may be adjusted based upon processing of a noise injected output. Noise injection is not selected where standard operation is desired. Where noise injection is not selected (block 435), the equalized output (block 415) is stored as a processing output to a memory (block 445). In contrast, where noise injection is selected (block 435), the noise injected output (block 430) is stored as the processing output to the memory (block 440).

Data processing is applied to the processing output in an attempt to recover originally written data that yields a decoded output (block 450). The data processing may include, but is not limited to, one or more iterations through a data detection algorithm and a data decoding algorithm. The results of the data processing including anomalies therein due to the injected noise are used to adjust parameters in the data processing circuit in an effort to reduce errors (block 455). In some cases, this parameter modification may be turned off where noise injection is not selected (block 435).

Figure 5:
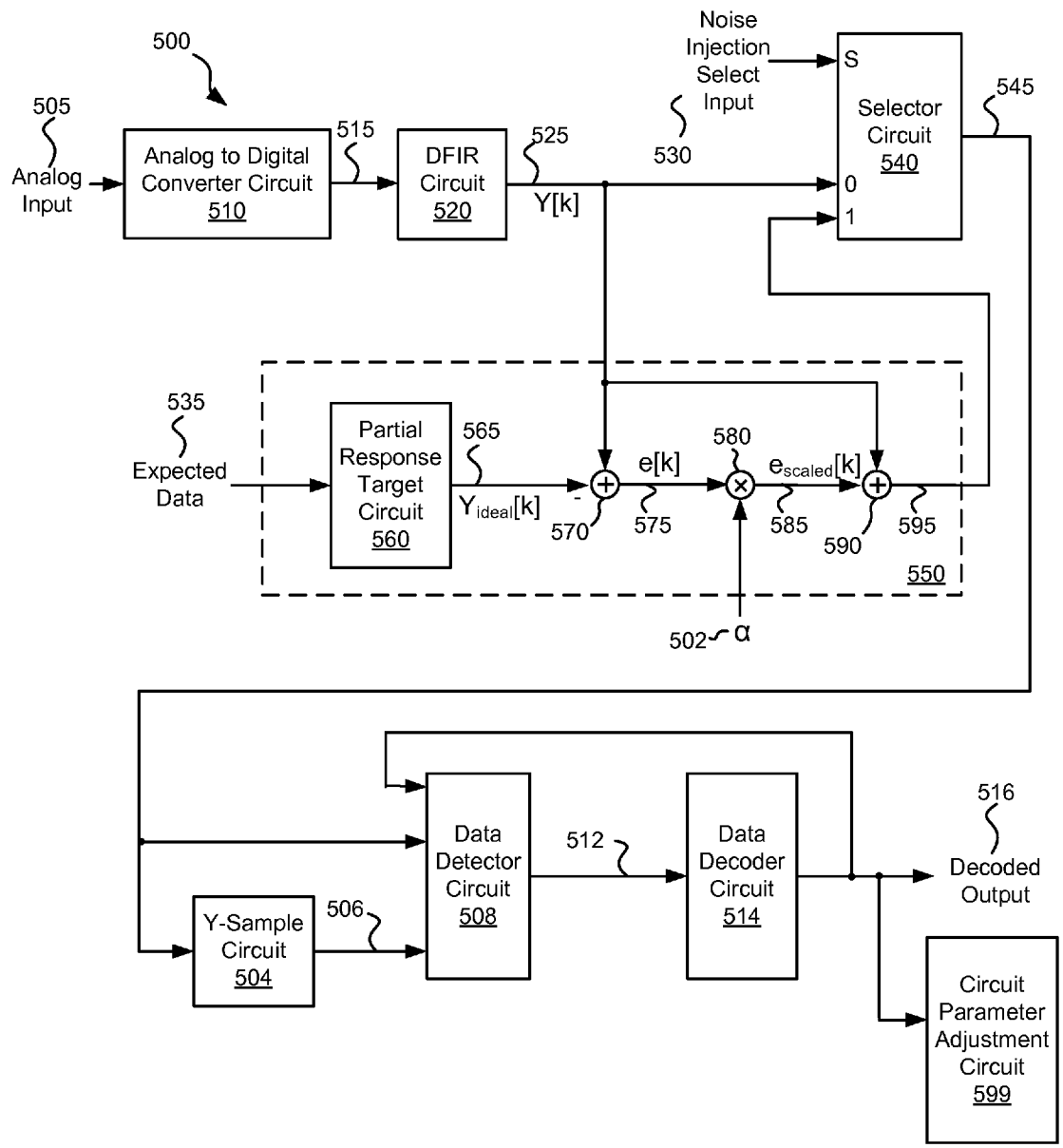
FIG. 5 depicts yet another data processing circuit including a noise injection circuit in accordance with other embodiments of the present invention.

Turning to FIG. 5, yet another data processing circuit 500 including a noise injection circuit 550 is shown in accordance with some embodiments of the present invention. Data processing circuit 500 includes an analog to digital converter circuit 510 that receives an analog input 505 and provides a series of corresponding digital samples 515. Analog input 505 may be derived from, for example, a storage medium or a data transmission channel. Based upon the disclosure provided herein, one of ordinary skill in the art will recognize a variety of sources of analog input 505. Analog to digital converter circuit 510 may be any circuit known in the art that is capable of converting an analog signal into a series of digital values representing the received analog signal. Digital samples 515 are provided to a digital finite impulse response circuit 520 that operates to equalize the received digitals samples 515 to yield an equalized output 525 (Y[k]). Based upon the disclosure provided herein, one of ordinary skill in the art will recognize a variety of equalizer circuits that may be used in place of digital finite impulse response circuit 520 in accordance with different embodiments of the present invention. Of note, equalized output 525 may include both electronic noise and media noise.

Equalized output 525 is provided to both a selector circuit 540 and noise injection circuit 550. A noise injected output 595 from noise injection circuit 550 is also provided to selector circuit 540. Selector circuit 540 provides one of equalized output 525 or noise injected output 595 as a processing output 545 depending upon an assertion level of a noise injection select input 530. In operation, noise injection select input 530 is asserted to cause selection of equalized output 525 to be provided as processing output 545 when normal operation of data processing circuit 500 is desired. In contrast, noise injection select input 530 is asserted to cause selection of noise injected output 595 to be provided as processing output 545 when circuit characterization of data processing circuit 500 is desired. Such circuit characterization involves modifying one or more parameters used by data processing circuit 500 to reduce any errors resulting from processing a given input data set. Such parameters may include, but are not limited to, gain parameters applied by analog to digital converter circuit 510 or by an analog front end circuit (not shown) from which analog input 505 is derived, filter taps used by digital finite impulse response filter 520, data detection parameters used by a data detector circuit 508, and/or data decode parameters used by a data decoder circuit 514. Based upon the disclosure provided herein, one of ordinary skill in the art will recognize a variety of parameters that may be adjusted based upon processing of noise injected output 595. Selection of through assertion of noise injection select input 530 may be done at the time of manufacture of a device including data processing circuit 500, and/or after deployment of a device including data processing circuit 500.

Noise injection circuit 550 includes a partial response target circuit 560 that is operable to receive an expected data input 535 and to yield a filtered output 565 ($Y_{ideal}$[k]). Expected data input 535 is a known data set corresponding to the data set received as analog input 505. Thus, where data processing circuit 500 is operating perfectly, the result of processing analog input 505 will be expected data input 535. Partial response target circuit 560 may be any circuit known in the art that is capable of rendering a received expected input 535 compatible with equalized output 525.

Both filtered output 565 and equalized output 525 are provided to a summation circuit 570 where filtered output 565 is subtracted from equalized output 525 to yield an error 575 (e[k]) in accordance with the following equation:

$$e[k] = Y[k] - Y_{ideal}[k],$$

where k designates particular instances of the associated values. Error 575 is provided to a multiplier circuit 580 where it is multiplied by a scalar value 502 ($\alpha$) to yield a scaled error 585 ($e_{scaled}$[k]) in accordance with the following equation:

$$e_{scaled}[k] = \alpha \times e[k].$$

In some embodiments of the present invention, scalar value 502 may be dynamically calculated by calculating the standard deviation of error 575 for two different data sets in accordance with the following equations:

$$v_1 = \text{std\_deviation}(e_1[k]),$$
$$v_2 = \text{std\_deviation}(e_2[k]), \text{ and}$$
$$\alpha = \frac{v_2}{v_1} = 10^{\Delta/20},$$

where the subscript "1" indicates a first data set, the subscript "2" indicates a second data set, and $\Delta$ is the signal to noise ratio of the first data set less the signal to noise ratio of the second data set as defined by the following equation:

$$\Delta = 10 \cdot \log 10 \frac{P}{v_1^2} - 10 \cdot \log 10 \frac{P}{v_2^2} = 10 \cdot \log 10 \frac{v_2^2}{v_1^2}.$$

In other embodiments of the present invention, scalar value 502 is a fixed value that is programmed into a memory (not shown) that is accessible to data processing circuit 500. Scaled error 585 is then added to equalized output 225 by a summation circuit 590 to yield noise injected output 595 ($Y_{noise}$[k]) in accordance with the following equation:

$$Y_{noise}[k] = Y[k] + e_{scaled}[k].$$

As such, noise injected output 595 is similar to equalized output 525 with the noise accentuated.

Processing output 545 is provided to both data detector circuit 508 and a Y-sample circuit 504. Y-sample circuit 504 stores processing output 545 as buffered data 506 for use in subsequent iterations through data detector circuit 508. Data detector circuit 508 may be any data detector circuit known in the art that is capable of producing a detected output 512. As some examples, data detector circuit 504 may be, but is not limited to, a Viterbi algorithm detector circuit or a maximum a posteriori detector circuit as are known in the art. Based upon the disclosure provided herein, one of ordinary skill in the art will recognize a variety of data detector circuits that may be used in relation to different embodiments of the present invention. Detected output 512 may include both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present invention.

Detected output 512 is provided to data decoder circuit 514. Data decoder circuit 514 applies a data decoding algorithm to detected output 512 in an attempt to recover originally written data. The result of the data decoding algorithm is provided as a decoded output 516. Similar to detected output 512, decoded output 516 may include both hard decisions and soft decisions. For example, data decoder circuit 514 may be any data decoder circuit known in the art that is capable of applying a decoding algorithm to a received input. Data decoder circuit 514 may be, but is not limited to, a low density parity check decoder circuit or a Reed Solomon decoder circuit as are known in the art. Based upon the disclosure provided herein, one of ordinary skill in the art will recognize a variety of data decoder circuits that may be used in relation to different embodiments of the present invention. One or more iterations through data detector circuit 508 and data decoder circuit 514 may be made in an effort to converge on the originally written data set.

Decoded output 516 is provided to circuit parameter adjustment circuit 599. Circuit parameter adjustment circuit 599 modifies one or more parameters used by data processing circuit 500 in an effort to reduce any errors remaining at the output of data detector circuit 508 and/or data decoder circuit 514. Circuit parameter adjustment circuit 599 may be any circuit known in the art that is capable of adjusting one or more parameters governing the operation of a circuit. As just some examples, circuit parameter adjustment circuit 599 may adjust gain parameters applied by analog to digital converter circuit 510 or by an analog front end circuit (not shown) from which analog input 505 is derived, filter taps used by digital finite impulse response filter 520, data detection parameters used by a data detector circuit 508, and/or data decode parameters used by a data decoder circuit 514. Based upon the disclosure provided herein, one of ordinary skill in the art will recognize a variety of parameters that may be adjusted by circuit parameter adjustment circuit.

Figure 6:
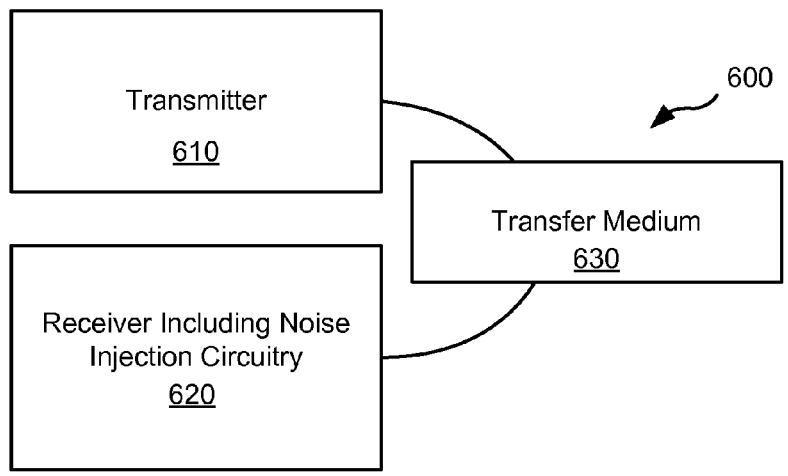
FIG. 6 shows a data transmission device including a receiver having noise injection circuitry in accordance with some embodiments of the present invention.

Turning to FIG. 6, a data transmission system 600 including a receiver 620 having noise injection circuitry is shown in accordance with some embodiments of the present invention. Data transmission system 600 includes a transmitter 610 that is operable to transmit encoded information via a transfer medium 630 as is known in the art. The encoded data is received from transfer medium 630 by receiver 620. Receiver 620 incorporates noise injection circuitry that may be implemented similar to that discussed above in relation to FIG. 2, FIG. 3 or FIG. 5 and/or operate similar to that described above in relation to FIG. 4.

Figure 7:
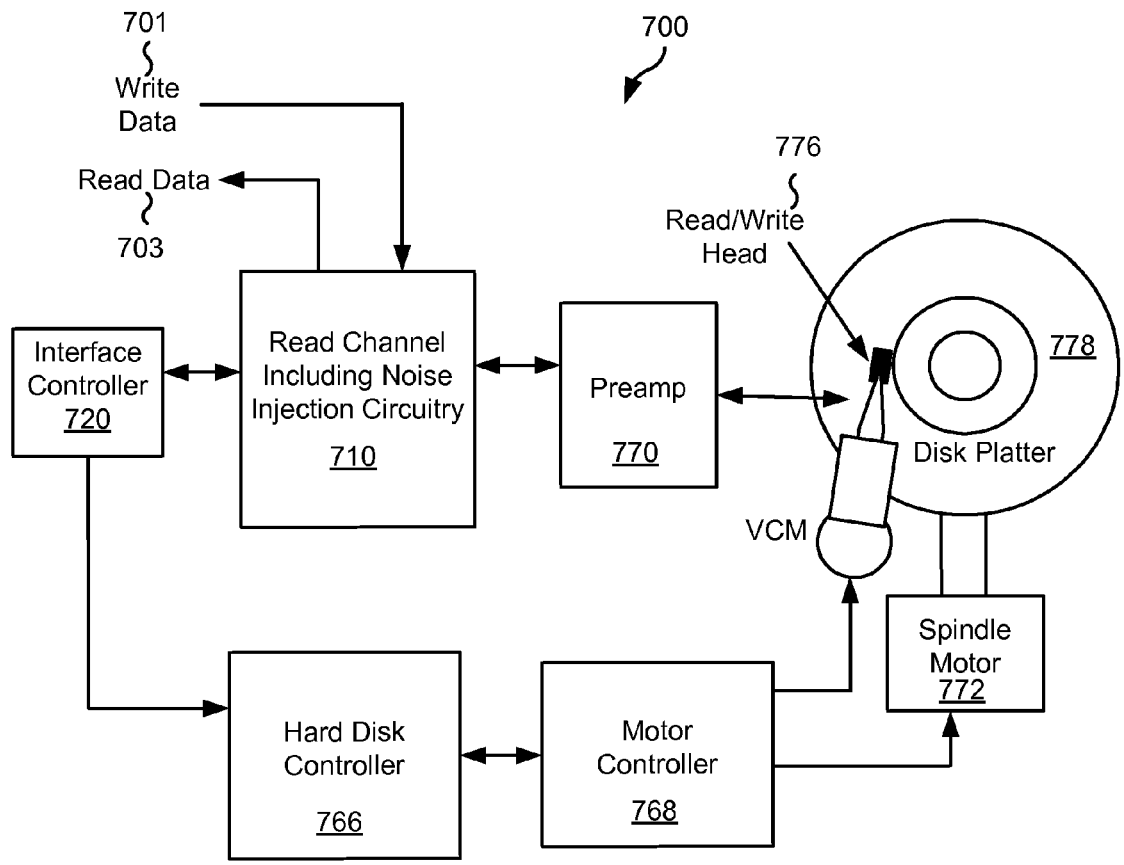
FIG. 7 shows a storage device including a read channel having noise injection circuitry in accordance with one or more embodiments of the present invention.

FIG. 7 shows a storage system 700 including a read channel circuit 710 with noise injection circuitry in accordance with some embodiments of the present invention. Storage system 700 may be, for example, a hard disk drive. Storage system 700 also includes a preamplifier 770, an interface controller 720, a hard disk controller 766, a motor controller 768, a spindle motor 772, a disk platter 778, and a read/write head assembly 776. Interface controller 720 controls addressing and timing of data to/from disk platter 778. The data on disk platter 778 consists of groups of magnetic signals that may be detected by read/write head assembly 776 when the assembly is properly positioned over disk platter 778. In one embodiment, disk platter 778 includes magnetic signals recorded in accordance with either a longitudinal or a perpendicular recording scheme.

In a typical read operation, read/write head assembly 776 is accurately positioned by motor controller 768 over a desired data track on disk platter 778. Motor controller 768 both positions read/write head assembly 776 in relation to disk platter 778 and drives spindle motor 772 by moving read/write head assembly to the proper data track on disk platter 778 under the direction of hard disk controller 766. Spindle motor 772 spins disk platter 778 at a determined spin rate (RPMs). Once read/write head assembly 778 is positioned adjacent the proper data track, magnetic signals representing data on disk platter 778 are sensed by read/write head assembly 776 as disk platter 778 is rotated by spindle motor 772. The sensed magnetic signals are provided as a continuous, minute analog signal representative of the magnetic data on disk platter 778. This minute analog signal is transferred from read/write head assembly 776 to read channel circuit 710 via preamplifier 770. Preamplifier 770 is operable to amplify the minute analog signals accessed from disk platter 778. In turn, read channel circuit 710 decodes and digitizes the received analog signal to recreate the information originally written to disk platter 778. This data is provided as read data 703 to a receiving circuit. A write operation is substantially the opposite of the preceding read operation with write data 701 being provided to read channel circuit 710. This data is then encoded and written to disk platter 778.

During one or more set up periods, noise injection circuitry injects noise into a read data stream to intentionally stress the system resulting in increased errors. During this process, one or more system parameters are modified to reduce the level of errors. Such modification of the parameters may be done during manufacture, and/or may be done once storage device 700 is deployed. The noise injection circuitry that may be implemented similar to that discussed above in relation to FIG. 2, FIG. 3 or FIG. 5 and/or operate similar to that described above in relation to FIG. 4.

It should be noted that storage system 500 may be integrated into a larger storage system such as, for example, a RAID (redundant array of inexpensive disks or redundant array of independent disks) based storage system. It should also be noted that various functions or blocks of storage system 500 may be implemented in either software or firmware, while other functions or blocks are implemented in hardware.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the inven-

What is claimed is:

1. A data processing circuit, the data processing circuit comprising:
    a noise injection circuit operable to:
        determine a difference between a first data output and a second data output to yield an error; and
        augment an interim data with a noise value corresponding to the error to yield a noise injected output, wherein the interim data is selected from a group consisting of: the first data output and the second data output.

2. The data processing circuit of claim 1, the data processing circuit further comprising:
    a data detector circuit operable to apply a data detection algorithm to an input derived from the noise injected output to yield a detected output; and
    a data decoder circuit operable to apply a data decode algorithm to the detected output to yield a decoded output.

3. The data processing circuit of claim 1, the data processing circuit further comprising:
    a selector circuit operable to provide a processing output selected from a group consisting of the first data output and the noise injected output.

4. The data processing circuit of claim 3, the data processing circuit further comprising:
    a data detector circuit operable to apply a data detection algorithm to the processing output to yield a detected output; and
    a data decoder circuit operable to apply a data decode algorithm to the detected output to yield a decoded output.

5. The data processing circuit of claim 1, the data processing circuit further comprising:
    an equalizer circuit operable to receive a data set and to provide an equalized output corresponding to the data set, wherein the first data output is the equalized output.

6. The data processing circuit of claim 5, wherein the second data output is derived from an expected output.

7. The data processing circuit of claim 6, the data processing circuit further comprising:
    a partial response target circuit operable to provide the second data output based at least in part on the expected output.

8. The data processing circuit of claim 6, the data processing circuit further comprising:
    a data detector circuit operable to apply a data detection algorithm to an input derived from the noise injected output to yield a detected output;
    a data decoder circuit operable to apply a data decode algorithm to the detected output to yield a decoded output; and
    wherein the expected output is derived from the decoded output.

9. The data processing circuit of claim 1, wherein determining the difference between the first data output and the second data output to yield the error includes subtracting the second data output from the first data output.

10. The data processing circuit of claim 1, wherein determining the difference between the first data output and the second data output to yield the error includes subtracting the first data output from the second data output.

11. The data processing circuit of claim 1, wherein augmenting the interim data with the noise value corresponding to the error to yield the noise injected output comprises:
    multiplying the error by a scaling factor to yield a scaled error; and
    adding the scaled error to one of the first data output or the second data output to yield the noise injected output.

12. The data processing circuit of claim 1, wherein the data processing circuit is implemented as part of a device selected from a group consisting of: a storage device and a receiving device.

13. The data processing circuit of claim 1, wherein the data processing circuit is implemented as part of an integrated circuit.

14. A method, the method comprising:
    receiving a first data output;
    receiving a second data output;
    determining a difference between a first data output and a second data output to yield an error; and
    augmenting an interim data with a noise value corresponding to the error to yield a noise injected output, wherein the interim data is selected from a group consisting of: the first data output and the second data output.

15. The method of claim 14, the method further comprising:
    selecting one of the first data output and the second data output as a processing output;
    applying a data detection algorithm to the processing output to yield a detected output; and
    applying a data decode algorithm to the detected output to yield a decoded output.

16. The method of claim 15, wherein:
    the data detection algorithm is selected from a group consisting of: a maximum a posteriori data detection algorithm, and a Viterbi algorithm detection; and
    wherein the data decode algorithm is selected from a group consisting of: a low density parity check algorithm, and a Reed Solomon algorithm.

17. The method of claim 14, wherein augmenting the interim data with the noise value corresponding to the error to yield the noise injected output comprises:
    multiplying the error by a scaling factor to yield a scaled error; and
    adding the scaled error to one of the first data output or the second data output to yield the noise injected output.

18. The method of claim 14, wherein determining the difference between the first data output and the second data output to yield the error includes subtracting the first data output from the second data output.

19. The method of claim 14, wherein determining the difference between the first data output and the second data output to yield the error includes subtracting the second data output from the first data output.

20. A storage device, the storage device comprising:
    a storage medium;
    a head assembly disposed in relation to the storage medium and operable to provide a sensed signal corresponding to information on the storage medium;
    a read channel circuit including:
        an analog processing circuit operable to provide an analog signal corresponding to the sensed signal;
        an analog to digital converter circuit operable to sample the analog signal to yield a series of digital samples;
        an equalizer circuit operable to equalize the digital samples to yield an equalized input;

a noise injection circuit operable to:
   determine a difference between the equalized output and an expected output to yield an error; and
   augment an interim data with a noise value corresponding to the error to yield a noise injected output, wherein the interim data is selected from a group consisting of: the equalized output and the expected output; and
a selector circuit operable to provide a processing output selected from a group consisting of the equalized output and the noise injected output;
a data detector circuit operable to apply a data detection algorithm to the processing output to yield a detected output; and
a data decoder circuit operable to apply a data decode algorithm to the detected output to yield a decoded output.

* * * * *